(12) United States Patent
Marques et al.

(10) Patent No.: US 10,536,115 B2
(45) Date of Patent: Jan. 14, 2020

(54) CRYSTAL DRIVER CIRCUIT WITH EXTERNAL OSCILLATION SIGNAL AMPLITUDE CONTROL

(71) Applicant: SILICON LABORATORIES INC., Austin, TX (US)

(72) Inventors: Tiago Marques, Austin, TX (US); Vitor Pereira, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 57 days.

(21) Appl. No.: 15/724,714

(22) Filed: Oct. 4, 2017

(65) Prior Publication Data

US 2019/0006990 A1    Jan. 3, 2019

Related U.S. Application Data

(60) Provisional application No. 62/527,475, filed on Jun. 30, 2017.

(51) Int. Cl.
*H03B 5/36* (2006.01)
*H03F 3/72* (2006.01)

(52) U.S. Cl.
CPC ............ *H03B 5/364* (2013.01); *H03B 5/366* (2013.01); *H03F 3/72* (2013.01); *H03B 2200/004* (2013.01); *H03B 2200/005* (2013.01); *H03B 2200/0012* (2013.01); *H03B 2200/0026* (2013.01); *H03B 2200/0066* (2013.01)

(58) Field of Classification Search
CPC .......... H03B 5/366; H03B 5/368; H03B 5/36; H03B 5/364; H03B 5/362; H03B 2200/0012; H03B 2200/005; H03B 2200/004; H03B 2200/0026; H03B 2200/0034; H03B 2200/0046; H03F 3/72
See application file for complete search history.

(56) References Cited

U.S. PATENT DOCUMENTS

| 4,321,562 | A | 3/1982 | Igarashi |
| 4,896,122 | A | 1/1990 | Tahernia et al. |
| 4,956,618 | A | 9/1990 | Ulmer |

(Continued)

OTHER PUBLICATIONS

Stephens, Ransom. "The Future of Multi-Clock Systems." Frequency Controls, Inc. 2007 pp. 1-14.

*Primary Examiner* — Ryan Johnson
(74) *Attorney, Agent, or Firm* — Huffman Law Group, PC

(57) ABSTRACT

A crystal driver integrated circuit with external oscillation signal amplitude control including an amplifier core, an input pin and an output pin, an adjustable capacitor, and a controller. The controller operates the amplifier core in any one of multiple operating modes including an oscillator mode and a bypass mode. During the bypass mode, the controller disables the amplifier core and adjusts the adjustable capacitor so that an amplitude of an oscillation signal received via the input pin from an external oscillator has a target amplitude. The external oscillation signal may be capacitively coupled for capacitive voltage division or directly coupled for impedance attenuation. An available voltage may be provided as a source voltage to the external oscillator via the output pin. An internal voltage regulator and/or switch may be included to re-provision the output pin to provide the source voltage during the bypass mode.

20 Claims, 4 Drawing Sheets

(56) References Cited

U.S. PATENT DOCUMENTS

| | | |
|---|---|---|
| 5,041,802 A | 8/1991 | Wei et al. |
| 5,208,558 A | 5/1993 | Shigehara et al. |
| 5,416,445 A | 5/1995 | Narahara |
| 5,453,719 A | 9/1995 | Narahara |
| 5,900,787 A | 5/1999 | Yoshimura |
| 5,912,594 A | 6/1999 | Burkhard |
| 6,094,105 A * | 7/2000 | Williamson ............ H03B 5/36 331/116 FE |
| 6,097,257 A | 8/2000 | Kadowaki et al. |
| 6,133,801 A | 10/2000 | Tanaka |
| 6,653,908 B1 | 11/2003 | Jones |
| 6,696,899 B2 | 2/2004 | Ruffieux |
| 6,782,485 B2 | 8/2004 | Takei |
| 7,034,628 B1 | 4/2006 | Lu et al. |
| 7,348,861 B1 | 3/2008 | Wu et al. |
| 7,808,334 B2 | 10/2010 | Yoshida et al. |
| 7,868,710 B1 | 1/2011 | Farahvaash et al. |
| 7,961,060 B1 | 6/2011 | McMenamy et al. |
| 8,324,978 B2 | 12/2012 | Loeda |
| 8,395,456 B2 | 3/2013 | Badillo et al. |
| 9,614,509 B1 * | 4/2017 | Ahmed ..................... H03K 5/15 |
| 2004/0169562 A1 | 9/2004 | Novac |
| 2005/0017812 A1 | 1/2005 | Ashida et al. |
| 2008/0211592 A1 | 9/2008 | Gaussen |
| 2009/0002087 A1 | 1/2009 | Toffolon et al. |
| 2009/0096541 A1 | 4/2009 | Tran |
| 2009/0121799 A1 | 5/2009 | Ishikawa |
| 2011/0037527 A1 | 2/2011 | Shrivastava et al. |
| 2011/0291767 A1 | 12/2011 | Ishikawa et al. |
| 2012/0242418 A1 | 9/2012 | Takahashi |
| 2013/0154754 A1 | 6/2013 | Frank |
| 2014/0035689 A1 | 2/2014 | Ozawa et al. |
| 2014/0091872 A1 | 4/2014 | Itasaka |
| 2014/0320223 A1 | 10/2014 | Ozawa et al. |
| 2016/0072438 A1 | 3/2016 | Fukahori |
| 2019/0006991 A1 | 1/2019 | Marques et al. |
| 2019/0006992 A1 | 1/2019 | Marques |
| 2019/0007005 A1 | 1/2019 | Marques |
| 2019/0007012 A1 | 1/2019 | Marques |

* cited by examiner

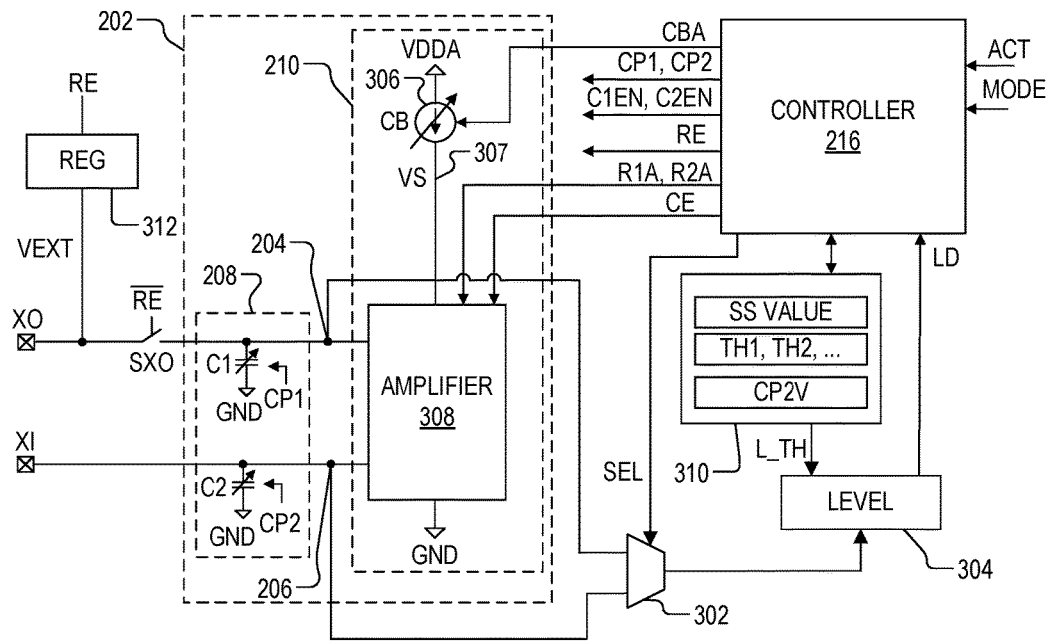
FIG. 3
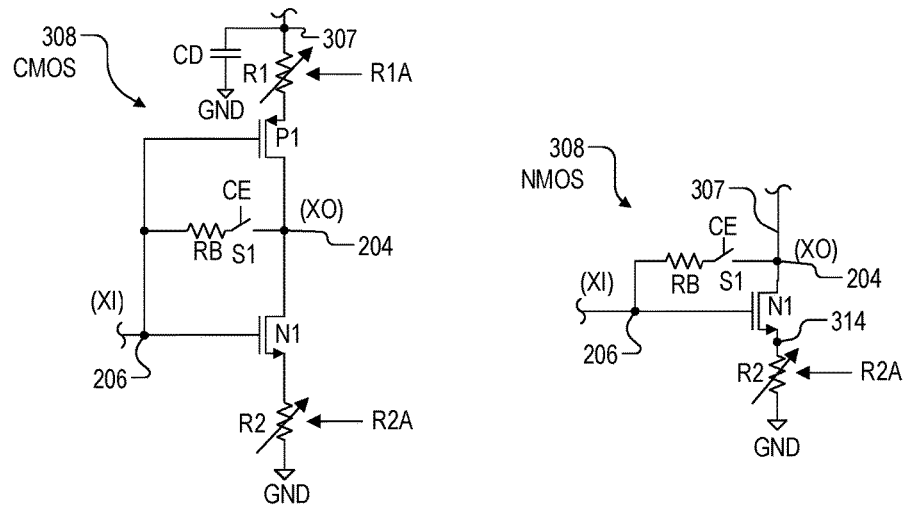
FIG. 4
FIG. 5

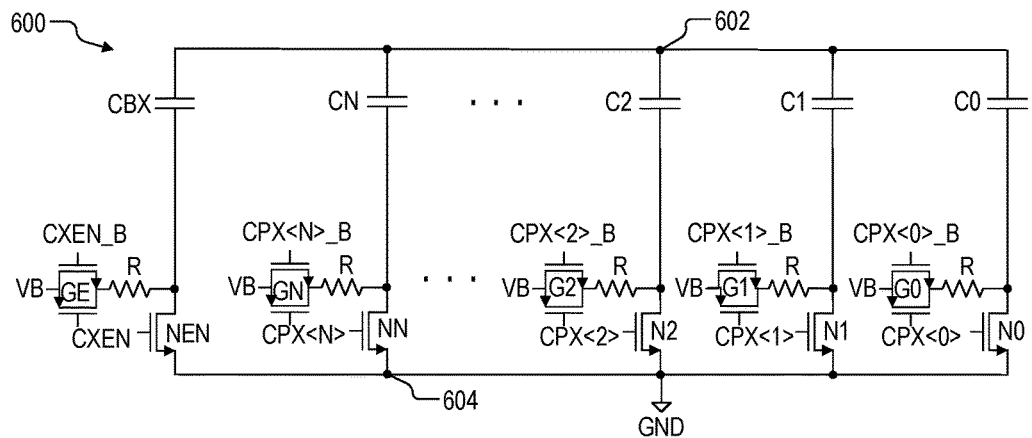
FIG. 6
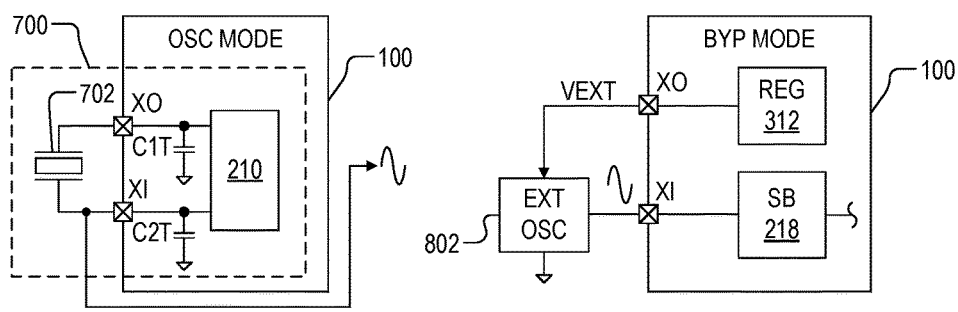
FIG. 7
FIG. 8
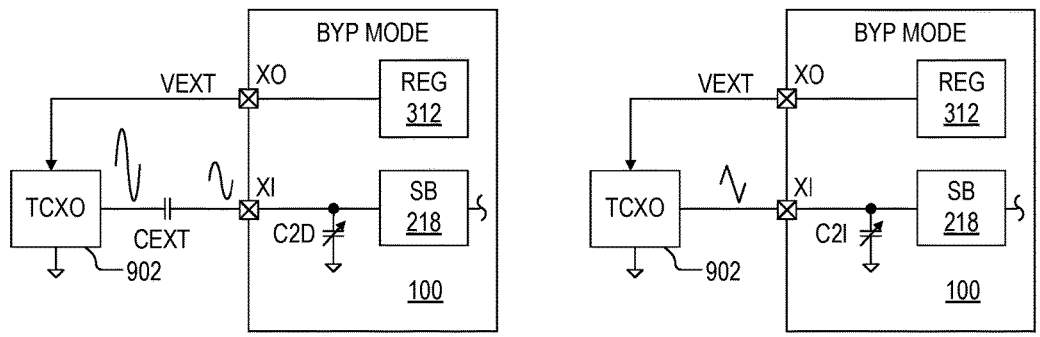
FIG. 9
FIG. 10

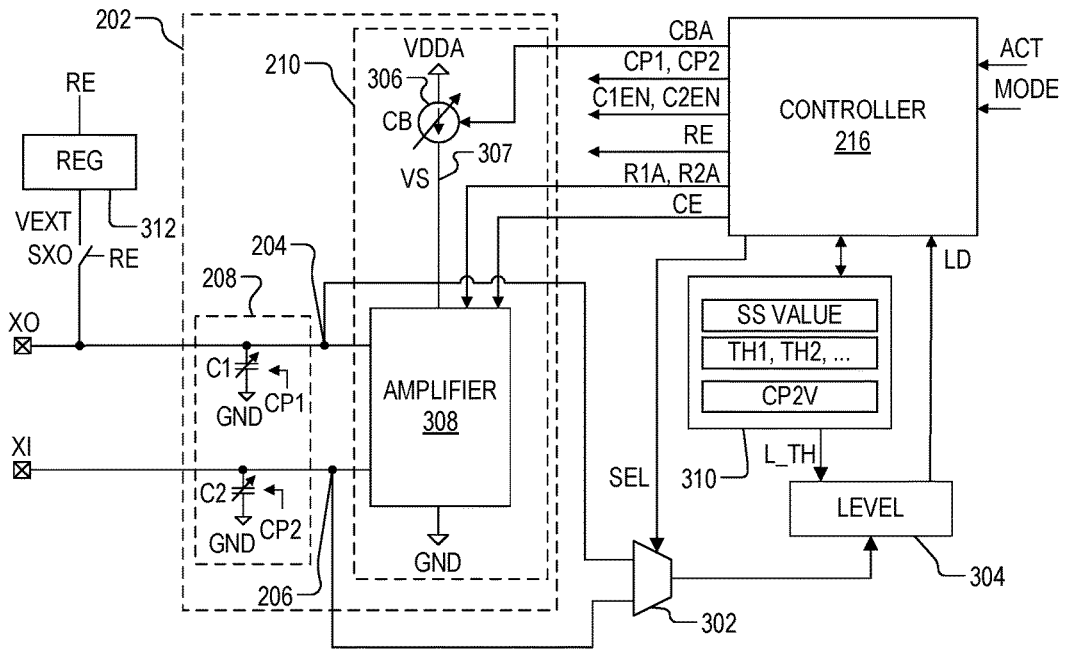
FIG. 11
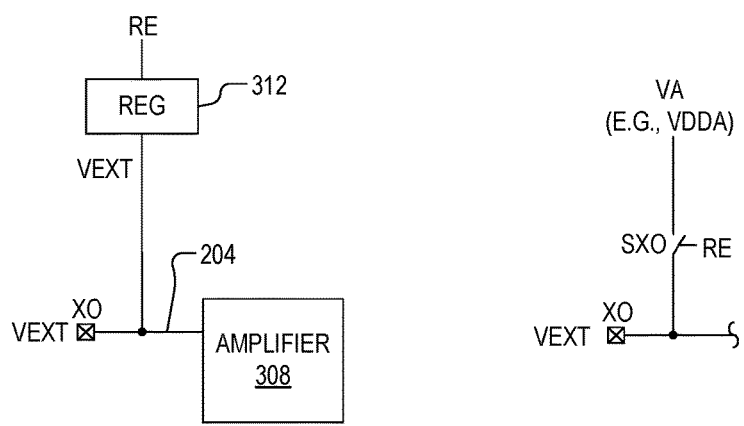
FIG. 12
FIG. 13

CRYSTAL DRIVER CIRCUIT WITH EXTERNAL OSCILLATION SIGNAL AMPLITUDE CONTROL

CROSS REFERENCE TO RELATED APPLICATION(S)

This application claims the benefit of U.S. Provisional Application Ser. No. 62/527,475, filed on Jun. 30, 2017, which is hereby incorporated by reference in its entirety for all intents and purposes.

This application is related to the following U.S. Patent Applications which are hereby incorporated by reference in their entireties for all intents and purposes.

| ATTORNEY DOCKET NUMBER | SERIAL NUMBER | FILING DATE | TITLE |
|---|---|---|---|
| SLL.0107 | 15/639,038 | Jun. 30, 2017 | CRYSTAL AMPLIFIER WITH ADDITIONAL HIGH GAIN AMPLIFIER CORE TO OPTIMIZE STARTUP OPERATION |
| SLL.0108 | 15/639,137 | Jun. 30, 2017 | CRYSTAL AMPLIFIER WITH RESISTIVE DEGENERATION |
| SLL.0109 | 15/639,267 | Jun. 30, 2017 | CRYSTAL DRIVER CIRCUIT WITH CORE AMPLIFIER HAVING UNBALANCED TUNE CAPACITORS |
| SLL.0110 | 15/645,684 | Jul. 10, 2017 | CRYSTAL DRIVER CIRCUIT CONFIGURABLE FOR DAISY CHAINING |

BACKGROUND OF THE INVENTION

Field of the Invention

The present invention relates in general to crystal oscillators, and more particularly, to a crystal driver circuit with multiple operating modes including a bypass mode with external oscillation signal amplitude control.

Description of the Related Art

A crystal oscillator uses the mechanical resonance of a crystal to create an electrical sinusoidal signal having a precise frequency. The crystal oscillator includes a crystal amplifier providing a "negative" resistance that cancels losses of the crystal to establish and maintain oscillation. In certain configurations, the crystal amplifier may include an N-channel MOS (NMOS) or a complementary MOS (CMOS) amplifier having an input and output for coupling across the crystal. The crystal may be modeled as a series combination of a motional capacitance, inductance, and resistance, and the crystal amplifier may be modeled as a negative resistance.

In many configurations an external oscillation signal may be available or needed. The amplitude of the external oscillation signal, however, may be too high for use by an integrated circuit incorporating the crystal amplifier.

SUMMARY OF THE INVENTION

A crystal driver integrated circuit with external oscillation signal amplitude control according to one embodiment includes an amplifier core, an input pin and an output pin, an adjustable capacitor, and a controller. The amplifier core has an input coupled to an amplifier input node and has an output coupled to an amplifier output node. The input pin is coupled to the amplifier input node and the output pin is coupled to the amplifier output node. The adjustable capacitor is coupled between the amplifier input node and a reference node. The controller operates the amplifier core in any one of multiple operating modes including an oscillator mode and a bypass mode. In the oscillator mode, the controller enables the amplifier core to drive an external crystal coupled between the input and output pins to oscillate at a target frequency. During the bypass mode, the controller disables the amplifier core and adjusts the adjustable capacitor so that an amplitude of an oscillation signal coupled via the input pin has a target amplitude.

The crystal driver integrated circuit may include a memory, such as a ROM or a RAM. The memory may store a capacitor level value, in which the controller uses the capacitor level value to adjust the adjustable capacitor. The crystal driver integrated circuit may further include a level detector having an input receiving an amplitude value indicative of a level of the amplifier input node and having an output providing a level detect value to the controller. The controller may adjust the adjustable capacitor until the level detect value indicates that the amplitude of the oscillation signal has the target amplitude. If the memory is provided and is programmable (e.g., a RAM), it may store a threshold value indicative of the target amplitude, in which the level detector compares the threshold level with the amplitude value to provide the level detect value. Also, once the controller determines the capacitor level value, it may store the capacitor level value into the memory.

The crystal driver integrated circuit may further include a voltage regulator and a switch. The voltage regulator has an output providing a source voltage to the output pin when enabled during the bypass mode. The switch couples the output pin and the amplifier output node during the oscillator mode and decouples the output pin from the amplifier output node during the bypass mode. Alternatively, the voltage regulator has an output providing a source voltage, and the switch selectively provides the source voltage to the output pin during the bypass mode. In another embodiment, the switch may be eliminated and the output of the voltage regulator remains coupled to the output pin and is enabled during the bypass mode. In yet another embodiment, an existing voltage regulator or any other available voltage of the crystal driver integrated circuit may be used in which the switch selectively couples the available voltage to the output pin during the bypass mode.

An electronic circuit according to one embodiment may include an external oscillator having an output providing an oscillation signal and a crystal driver integrated circuit with external oscillation signal amplitude control having an input pin receiving the oscillation signal. The electronic circuit may further include an external capacitor coupled between the output of the external oscillator and the input pin of the crystal driver integrated circuit.

A method of controlling the amplitude of an oscillation signal provided to a crystal driver integrated circuit according to one embodiment includes providing the crystal driver integrated circuit with an amplifier core having an input coupled to an amplifier input node and having an output coupled to an amplifier output node, an input pin coupled to the amplifier input node and an output pin coupled to the amplifier output node, providing the crystal driver integrated circuit with an adjustable capacitor coupled between the amplifier input node and the reference node, and, during a bypass mode, disabling the amplifier core, and adjusting the adjustable capacitor so that an amplitude of an oscillation signal provided via the input pin has a target amplitude.

The method may include retrieving a stored capacitor level value used for adjusting the adjustable capacitor. The method may include comparing the amplitude of the oscillation signal received via the input pin with a predetermined threshold value and providing a level detect value indicative thereof, in which case the memory may include adjusting the adjustable capacitor until the level detect value is provided. The method may further include providing, by the crystal driver integrated circuit, an available voltage to the output pin which may be used to provide source voltage to an external oscillator.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a schematic and block diagram of the crystal amplifier of FIG. 2 implemented according to one embodiment of the present invention shown coupled to a controller, and further including a select circuit, a level detector, a memory, and a voltage regulator.

FIG. 4 is a schematic diagram of the amplifier of FIG. 3 implemented according to a CMOS configuration according to one embodiment of the present invention.

FIG. 5 is a schematic diagram of the amplifier of FIG. 3 implemented according to an NMOS configuration according to one embodiment of the present invention.

FIG. 6 is a simplified schematic diagram of an adjustable tune capacitor that may be used as either one or both of the tune capacitors of FIG. 3.

FIG. 7 is a simplified block diagram illustrating the IC of FIG. 1 configured to operate in an oscillator mode including an external crystal, collectively forming a crystal oscillator.

FIG. 8 is a simplified block diagram illustrating the IC of FIG. 1 configured to operate in a bypass mode and receiving an external oscillation signal from an external oscillator according to one embodiment of the present invention.

FIG. 9 is a simplified block diagram illustrating the IC of FIG. 1 configured to operate in the BYP mode for receiving an external oscillation signal from a capactively-coupled external source and further including amplitude control for controlling the amplitude of the external oscillation signal according to one embodiment of the present invention.

FIG. 10 is a simplified block diagram illustrating the IC 100 configured to operate in the BYP mode for receiving an external oscillation signal directly from an external source and further including amplitude control for controlling the amplitude of the external oscillation signal according to another embodiment of the present invention.

FIG. 11 is a schematic and block diagram of the crystal amplifier of FIG. 2 implemented according to another embodiment of the present invention shown coupled to a controller, and further including a select circuit, a level detector, a memory, and a voltage regulator.

FIG. 12 is a schematic and block diagram illustrating another variation according to another embodiment of the present invention in which the voltage regulator switch is eliminated.

FIG. 13 is a simplified schematic diagram illustrating yet another embodiment in which an available voltage, shown as VA, is provided via the XO pin to provide the external voltage VEXT so that the voltage regulator may also be eliminated.

DETAILED DESCRIPTION

The inventors have recognized the need to provide a crystal amplifier integrated circuit (IC) that is capable of both generating an oscillation signal or for using an external oscillation signal. They have therefore developed a crystal driver circuit with multiple operating modes including a bypass mode with external oscillation signal amplitude control. During a normal oscillation mode, an external crystal is coupled between an amplifier input and an amplifier output and an internal crystal amplifier provides the appropriate level of negative resistance for oscillation. Adjustable tune capacitors may be provided, each coupled to a corresponding one of the amplifier input and amplifier output, so that the load or combined capacitance, including any parasitic capacitance, may be adjusted to tune the frequency of the oscillation signal to a target frequency.

During the bypass mode, the crystal driver is disabled and an external oscillation signal provided to the amplifier input is fed directly to internal circuitry, such as a squaring buffer or the like. When the amplitude of the external oscillation signal is too high, the corresponding tune capacitor is adjusted to reduce the amplitude to the target level. The external oscillation signal may be capacitively coupled using an external capacitor, in which case the external capacitor and the internal adjustable tune capacitor together form a capacitor voltage divider that is used to adjust the amplitude of the external oscillation signal. Alternatively, the external oscillation signal may be directly coupled (e.g., DC coupled), in which case the internal adjustable tune capacitor provides a variable load for an external oscillator having a limited current output. In the DC-coupled case, adjustment of the tune capacitor changes the impedance at the output of the external oscillator. The external oscillation signal may be distorted (e.g., from a sinusoidal waveform to a triangular waveform) with a reduced magnitude.

The adjustment of the internal tune capacitor may be made by an automatic amplitude control process similar to an automatic gain control process. An internal voltage generator may be enabled or otherwise used to provide a source voltage to the output pin, and the amplifier output pin may be re-provisioned to convey the source voltage to external devices, such as an external oscillator.

Figure 1:
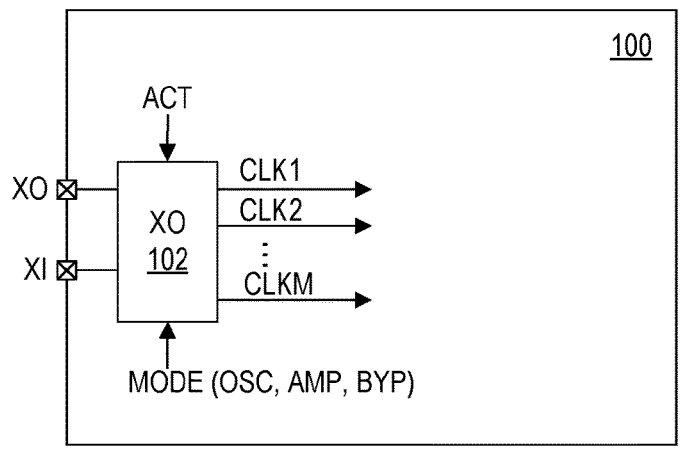
FIG. 1 is a simplified block diagram of an integrated circuit (IC) including a crystal oscillator (XO) system implemented according to one embodiment of the present invention.

FIG. 1 is a simplified block diagram of an integrated circuit (IC) 100 including a crystal oscillator (XO) system 102 implemented according to one embodiment of the present invention. The illustrated IC 100 is shown in simplified form including the XO system 102, which is provided to generate a number "M" of clock signals, shown as CLK1, CLK2, CLKM, in which M is any positive integer greater than 0. In one embodiment, the IC 100 may incorporate only the XO system 102 as part of a clock semiconductor chip or the like. Although the clock signals CLK1-CLKM may be provided off chip via corresponding pins or interfaces or the like, these signals are digital clock signals in square-wave format that may cause unwanted emissions and/or harmonics. Although not shown, the IC 100 may incorporate additional circuitry for implementing a desired electronic function that may use one or more of the clock signals CLK1-CLKM, such as according to any of various wired or wireless communication applications. Wireless applications may include, for example, Bluetooth®, Zigbee, Wi-Fi, etc. Other functional circuit blocks and circuits may be included for particular applications, but are not shown as not necessary for a full and complete understanding of the present invention. The IC 100 may be mounted on a printed circuit board (PCB) (not shown), a module (not shown), or the like as part of a larger electronic system.

In one embodiment, the XO system 102 may be maintained in a power-down or standby mode when not being used. In the illustrated configuration, the IC 100 provides an activation signal ACT which is asserted to activate or enable the XO system 102 and negated to place the XO system 102 into a standby mode. The IC 100 also provides a MODE signal to the XO system 102 for placing the XO system 102 including any one of multiple operating modes as further described herein. The XO system 102 may be coupled to an external device via an amplifier output pin XO and/or an amplifier input pin XI. As described further herein, for example, MODE may indicate an oscillator (OSC) mode, in which the XO system 102 interfaces an external crystal 702 (FIG. 7) coupled between XI and XO. In the OSC mode, the XO system 102 develops an oscillating signal with a target frequency and/or target amplitude. MODE may further indicate a bypass (BYP) mode, in which the external oscillation signal may be directly used to develop the clock signals CLK1-CLKM.

The electronic system incorporating the IC 100 may be implemented any one of various configurations, such as a communication device (hand-held, mobile, stationary, etc.), a computer system (laptop, desktop, server system, etc.), a computer peripheral device (e.g., printer, router, etc.), or any other devices that may be networked together via wired and/or wireless communications. The present disclosure contemplates the use of the IC 100 incorporated within a device that may be part of a suite of components of an Internet of Things (IoT) platform or the like. The components or devices may be powered from an external source (e.g., AC outlet or the like), or may be battery-operated. Generally, it is understood that the present invention may be used in any application that uses a crystal oscillator.

Figure 2:
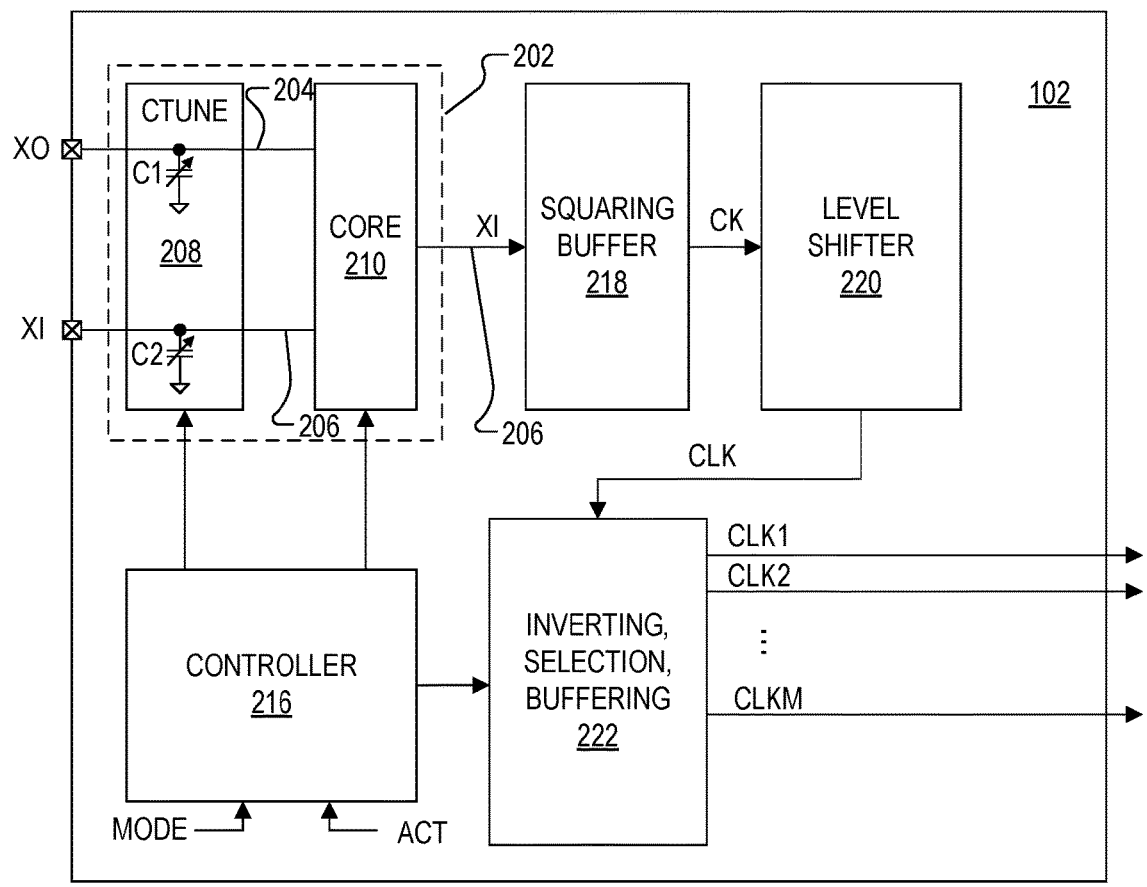
FIG. 2 is a simplified block diagram of the XO system of FIG. 1 incorporating a single crystal amplifier and supporting circuitry.

FIG. 2 is a simplified block diagram of the XO system 102 incorporating a single crystal amplifier 202 and supporting circuitry. XO is internally coupled an amplifier output node 204 and XI is internally coupled to an amplifier input node 206. As used herein, "XO" generally refers to the XO pin and/or the amplifier output node 204 (unless specifically referencing the XO system 102), and "XI" generally refers to the XI pin and/or the amplifier input node 206. The crystal amplifier 202 includes a tune capacitor (CTUNE) circuit 208 and an amplifier core 210, which are both coupled to the amplifier input and output nodes 204 and 206. The CTUNE circuit 208 includes a first capacitor C1 coupled between the amplifier output node 204 and a reference node and a second capacitor C2 coupled between the amplifier input node 206 and the reference node. The reference node develops a suitable positive, negative or zero voltage level, such as ground (GND). The capacitors C1 and C2 are shown as adjustable capacitors, although fixed tune capacitors are also contemplated. In an alternative embodiment, the tune capacitors may be omitted and otherwise provided externally.

The amplifier input node 206, or XI, is coupled to an input of a squaring buffer 218, which converts an oscillating signal developed on XI, which generally has a sinusoidal waveform, to a squarewave clock signal CK. CK is provided to an input of a level shifter 220, which adjusts the voltage level of CK and provides a corresponding clock signal CLK to an input of an inverting, selection, and buffering circuit 222. The inverting, selection, and buffering circuit 222 incorporates multiple inverters, multiplexers (MUXes), and buffers or the like for providing the clock signals CLK1-CLKM based on CLK, in which CLK1-CLKM may include one or more inverted clock signals. The inverting, selection, and buffering circuit 222 may also convert one or more of the clock signals or inverted clock signals CLK1-CLKM from single-ended to differential format. A controller 216 has corresponding outputs for selecting between each clock signal or its inverted version. One or more of the selected clock signals may be provided directly to selected portions of the IC 100. One or more of the selected clock signals may also be provided to other circuitry (not shown) for further processing, such as clock synthesizers or the like (not shown), for providing one or more modified clock signals (e.g., changes of one or more of frequency, duty cycle, amplitude, etc.) for use by other portions of the IC 100. The particular clock signals or uses thereof are not further described herein.

The controller 216 receives the ACT signal for activating the XO system 102 and for returning the XO system 102 to the standby mode. The controller 216 has an adjust output to adjust the capacitance values of the first and second adjustable capacitors C1 and C2 (when included and when adjustable). The controller 216 has one or more additional outputs for adjusting operation of the amplifier core 210. The controller 216 may also have one or more additional outputs for enabling various blocks and for controlling various parameters of the amplifier core 210.

The controller 218 also receives the MODE signal for controlling operation of the crystal amplifier 202 according to a selected mode of operation as further described herein. The OSC mode is the normal operating mode, in which the crystal amplifier 202 sustains oscillation of the external crystal 702 coupled between XI and XO by generating the appropriate level of negative resistance between XO and XI to develop an oscillation signal. The tune capacitors C1 and C2 collectively form a tune capacitance CT for tuning the oscillating signal to a target frequency in the OSC mode.

In the BYP mode, the crystal amplifier 202 is effectively shut off or disabled and the external oscillation signal provided on XI is provided to the squaring buffer 218 for developing CLK1-CLKM. In the BYP mode, C2 may be disabled or effectively removed (although parasitic capacitance may still be present). If the external oscillation signal provided to XI, however, has an excessive amplitude, then C2 may be adjusted to set the amplitude at XI to a lower, target amplitude level as further described herein.

FIG. 3 is a schematic and block diagram of the crystal amplifier 202 implemented according to one embodiment of the present invention shown coupled to the controller 216, and further including a select circuit 302, a level detector 304, a memory 310, and a voltage regulator 312 (REG). The memory 310 is coupled to the controller 216 and may store values used by the controller 216 for controlling operation. The select circuit 302 is shown as a multiplexer (MUX) or the like, having a pair of inputs for selecting between the amplifier output node 204 and the amplifier input node 206 based on a select input receiving a select signal SEL from the controller 216. The select circuit 302 provides a selected output to an input of the level detector 304. The level detector 304 may be implemented as a peak detector, an amplitude detector, a signal level detector, such as for determining the root-mean-square (RMS) level of an input voltage level, etc. The level detector 304 provides a level detect value LD to an input of the controller 216. It is noted that the level detector 304 may incorporate the select circuit 302 and receive SEL for selecting between nodes 204 or 206. In one embodiment, the level detector 304 asserts LD when a level of a selected one of the amplifier input and output nodes 206 or 204 reaches a level threshold.

One or more threshold values TH1, TH2, etc., may be defined and stored in the memory 310. The memory 310 may be a read-only memory (ROM) or the like. Alternatively, the memory 310 may be a random-access memory (RAM) or the like for determining and storing one or more different values during operation. The threshold values stored in the memory 310 are accessed by the level detector 304 via a signal L_TH. The first threshold TH1, for example, may have a value indicative of a target level of a signal on XI or the amplifier input node 206. Similarly, the second threshold TH2 may have a value indicative of a target level of a signal on XO or the amplifier output node 204.

The amplifier core 210 includes an adjustable current source 306 and an amplifier 308. The current source 306 is coupled to a source voltage VDDA, and provides a core bias (CB) current to a source node 307 developing a source voltage VS. The current source 306 includes an adjust input receiving a value CBA from the controller 216 for adjusting the level the core bias current. The current source 306 provides the core bias current, CB, to the amplifier 308 referenced to GND. The amplifier 308 is coupled to the amplifier output node 204 and the amplifier input node 206. C1 is coupled between XO and GND as previously described and receives an adjust signal CP1 from the controller 216. Similarly, C2 is coupled between XI and GND as previously described and receives an adjust signal CP2 from the controller 216.

The controller 216 may be implemented as a digital state machine or the like in which adjustments of the crystal amplifier 202 are made by providing and/or updating changing digital code values to various components. Although the controller 216 is shown embodied within a single block within the XO system 102, control functions may be distributed at various locations within the XO system 102 and/or within the IC 100. One or more of the digital code values as described herein may be adjustable or otherwise programmable within a corresponding programmable memory or the like (not shown). CBA may be a digital code value provided to the current source 306, in which the controller 216 adjusts CBA to adjust the core bias current provided to the source node 307 accordingly. Likewise, the controller 216 may provide CP1 and CP2 as separate digital control values for adjusting the capacitances of C1 and C2, respectively. The controller 216 may also provide enable signals C1EN and C2EN used in conjunction with CP1 and CP2 to enable or disable one or both of the capacitors C1 and C2. The controller 216 may provide two additional digital code values R1A and R2A, described further below, to the amplifier 308. The controller 216 may also provide a core enable signal CE to the amplifier 308 to facilitate enabling or disabling the amplifier core 210 as further described herein. The controller 216 is also shown receiving ACT and MODE for controlling the mode of operation.

Operation of the crystal amplifier 202 is now briefly described. The crystal amplifier 202 may initially be placed into a standby mode and remains in standby while ACT is negated. When MODE is set to OSC and the crystal 702 is connected between XO and XI, ACT may be asserted to initiate startup, in which case the controller 216 performs a startup routine or process to initialize oscillation. The CE signal is asserted to enable the amplifier 308 as further described herein. C1EN and/or C2EN may be asserted (if negated), and CP1 and CP2 may be adjusted to set C1 and C2 to their tune values. The startup process is not further described, but generally includes starting with a high value of core bias current via CBA until oscillation is achieved. Once oscillation is determined to be achieved, the controller 216 adjusts CBA to reduce the core bias current to a steady state level.

In one embodiment, the steady state current level of the core bias current is known. For example, the controller 216 may store a digital steady state (SS) value in the memory 310 and adjust CBA to the SS value for steady state operation. In one embodiment, the controller 216 may perform an automatic gain control (AGC) process or the like to determine the steady state level of the core bias current that achieves a signal on XI or XO achieving a target amplitude, determines the corresponding SS value, and stores the SS value into the memory 310 for future use. When ACT is next negated low, the controller 216 may perform a shutdown operation or the like to place the amplifier core 202 back into the standby mode. Alternatively, ACT may remain asserted or not be provided in configurations in which the crystal amplifier 202 remains enabled.

In the OSC mode of operation, the controller 216 may perform the AGC process upon each startup, such as for determining an adjusted SS value for each operating session, or in response to another stimulus or event, such as a temperature change or any other prompt from other circuitry on the IC 100 or from the electronic system. In one embodiment, the controller 216 asserts SEL to select XI or XO, and the level detector 304 accesses a corresponding threshold value, such one of TH1 and TH2 provided via L_TH. The controller 216 adjusts CBA to adjust the core bias current until the target level is achieved as indicated by the level detector 304 providing LD. When the level is at a predetermined target level, the level detector 304 asserts LD indicating that the amplitude of the monitored signal has reached the threshold, and the controller 216 determines the steady state level for the core bias current.

When MODE indicates the BYP mode of operation, the controller 216 sets CBA to set the core bias current to zero, and negates CE to disable the amplifier 308 so that the core amplifier 210 is disabled. In the BYP operating mode, since XI is provided to the squaring buffer 218 as shown in FIG. 2, an external oscillation signal provided to XI may be used internally to develop the clock signals CLK1-CLKM. If it can be assumed that the frequency and amplitude of the external oscillation signal are at the target levels, then the capacitance of C2 may be disabled (or otherwise bypassed).

In the BYP operating mode, the external oscillation signal provided to XI may have an excessive amplitude which may not be suitable for the IC 100. As described further herein, when the external oscillation signal has an excessive amplitude, the capacitance of C2 may be adjusted to reduce the amplitude of the external oscillation signal to an acceptable level. The output of the oscillator providing the external oscillation signal may be directly coupled or capacitively coupled. Also, the controller 216 is configured to perform an automatic amplitude control (AAC) process which is similar to the AGC process for adjusting the amplitude of the signal on XI. For AAC, rather than controlling the core bias current, the controller 216 instead adjusts the capacitance of the capacitor C2 to adjust the amplitude of the external oscillating signal provided to the IC 100 via XI. In a similar manner as the AGC process, for the AAC process, the controller 216 asserts SEL to select XI via the amplifier input node 206 and the level detector 304 selects the threshold indicative of the target amplitude for XI. The controller 216 adjusts CP2 to adjust the capacitance of C2 until LD indicates that the target amplitude is achieved. The determined value for CP2 may be stored in the memory 310 as a capacitor level value CP2V.

The XO system 102 may further include a voltage regulator 312 having an enable input receiving a regulator enable signal RE from the controller 216, and an output providing a voltage VEXT on the XO pin. Also, a switch SXO may be included having switched terminals coupled between the XO pin and the amplifier output node 204, and having a control input receiving a signal $\overline{RE}$, which is an inverted version of the regulator enable signal RE. In most operating modes including the OSC mode, RE is negated low so that $\overline{RE}$ is asserted high so that the voltage regulator 312 is disabled and the switch SXO is closed. In this case, the voltage regulator 312 is inoperative and XO functions as the amplifier output pin. When the controller 216 asserts RE high so that $\overline{RE}$ is asserted low, such as during selected BYP operating modes as further described herein, the switch SXO is opened effectively isolating the XO pin from the amplifier output node 204 and other circuitry. Also, the voltage regulator 312 is enabled and provides the VEXT voltage on XO. As described further herein, VEXT may be used as a voltage source to provide power to an external oscillator or clock source providing the external oscillation signal.

FIG. 4 is a schematic diagram of the amplifier 308 implemented according to a CMOS configuration according to one embodiment of the present invention. In this case, the CMOS amplifier 308 includes a P-channel transistor P1, an N-channel transistor N1, a decoupling capacitor CD, a bias resistor RB, an enable switch S1, a first degeneration resistor R1, and a second degeneration resistor R2. CD is coupled between the source node 307 and GND. R1 is coupled between the source node 307 and a source terminal of P1, and has a control input receiving R1A from the controller 216. The gate terminal of P1 is coupled to the amplifier input node 206, and the drain terminal of P1 is coupled to the amplifier output node 204. N1 has its drain terminal coupled to the amplifier output node 204, its gate terminal coupled to the amplifier input node 206, and its source terminal coupled to one terminal of R2. The other terminal of R2 is coupled to GND, and R2 has a control input receiving R2A from the controller 216. RB and S1 are coupled in series between the amplifier input node 206 and the amplifier output node 204.

The CMOS amplifier 308 is enabled by asserting CE to close switch S1 and driving the core bias current to a suitable current level depending upon the mode of operation. The CMOS amplifier 308 is disabled by negating CE to open switch S1 and to set the core bias current to zero. The degeneration resistors R1 and R2 may be set by the controller 216 to suitable values to reduce frequency drift in the OSC mode, or may be set to zero (or shorted) if desired. In the illustrated embodiment, the resistors R1 and R2 are shown as adjustable resistors. In an alternative embodiment, at least one of the resistors R1 and R2 may be fixed. In another alternative embodiment, either one of the resistors R1 and R2 may be eliminated (e.g., replaced by a short). Also, R1 and R2 may have the same resistance, or may have different resistances.

It is noted that each of the transistors described herein, including P1 and N1, are one of at least two different conductivity types, such as either N-type (e.g., N-channel) or P-type (e.g., P-channel). Each transistor includes two current terminals (e.g., drain and source terminals), and a control terminal (e.g., gate terminal). In the illustrated configuration, each transistor may be configured as a MOS transistor or a FET or the like, including any one of various configurations of MOSFETs and the like. For example, the N-type transistors may be NMOS transistors or NFETs, and the P-type transistors may be PMOS transistors or PFETs.

FIG. 5 is a schematic diagram of the amplifier 308 implemented according to an NMOS configuration according to one embodiment of the present invention in which P1, CD, and R1 used for the CMOS configuration may be eliminated. The current source 306 is provided for both configurations. For the NMOS amplifier 308, however, node 307 is effectively merged into node 204 since P1 and R1 are eliminated, and the current source 306 provides the core bias current directly to the amplifier output node 204. RB and S1 remain coupled in series between nodes 204 and 206 in the same manner. Operation is substantially similar and only one degeneration resistor, shown as R2, is provided. R2 may be controlled in similar manner and/or eliminated or shorted. In another embodiment, R1 may be included and coupled between nodes 307 and 206, and may be fixed or adjustable.

FIG. 6 is a simplified schematic diagram of an adjustable tune capacitor 600 that may be used as either one or both of the capacitors C1 and C2. The tune capacitor 500 includes a pair of capacitor terminals 602 and 604 representing the terminals of the tune capacitor (C1 or C2) that it implements. Generally, the capacitor terminal 604 is coupled to GND for each tune capacitor, and the capacitor terminal 602 for C1 is coupled to the amplifier output node 204 (XO) and the capacitor terminal 602 for C2 is coupled to the amplifier input node 206 (XI).

The tune capacitor 600 includes a series of N+1 capacitors C0, C1, CN and a corresponding series of N+1 N-channel transistor switches N0-NN, in which each capacitor is coupled in series with the current terminals of a corresponding one of the transistor switches between the capacitor terminals 602 and 604. Thus, C0 is coupled in series with N0 between the terminals 602 and 604, C1 is coupled in series with N1 between the terminals 602 and 604, and so on, each forming one of multiple switch-capacitor pairs coupled in parallel between the capacitor terminals 602 and 604. One terminal of each of the capacitors C0-CN is coupled to the capacitor terminal 602. In each case, the drain terminal of the transistor switch is coupled to the other terminal of a corresponding one of the capacitors, and the source terminal is coupled to the capacitor terminal 604. Each of the transistor switches N0-NN has a gate terminal receiving a corresponding one of N+1 control bits CPX<0>, CPX<1>, CPX<N> from the controller 216, in which "X" is either "1" or "2" for CP1 or CP2, respectively. Thus, CPX<0> is provided to the gate terminal of N0, CPX<1> is provided to the gate terminal of N1, and so on.

A series of N+1 resistors R are further provided, each having one terminal coupled to the junction between the resistor-transistor switch pairs between the capacitor terminals 602 and 604. The other terminal of each resistor R is coupled to one current terminal of a corresponding one of a series of N+1 pass gates (a.k.a., transmission gates) G0, G1, GN. The other current terminal of each of the pass gates G0-GN is coupled to a bias voltage VB. Each pass gate G0-GN is shown implemented as a parallel combination of a P-channel transistor and an N-channel transistor, in which the source terminal of one of the transistors of each pass gate is coupled to the drain terminal of the other, and vice-versa. Each pass gate includes a P-gate control terminal (gate terminal of internal P-channel transistor) and an N-gate control terminal (gate terminal of internal N-channel transistor). The P-gate control terminal of each pass gate G0-GN receives a corresponding one of the control bits CPX<0>-CPX<N>. The corresponding N-gate control terminal of each pass gate G0-GN receives a corresponding one of inverted control bits CPX<0>_B-CPX<N>_B, in which CPX<0>_B is an inverted version of CPX<0>, CPX<1>_B is an inverted version of CPX<1>, and so on.

An additional "balance" capacitor CBX and transistor switch NEN may be coupled in series between the capacitor terminals 602 and 604, in which CBX is CB1 for C1 and CB2 for C2. An enable signal CXEN is provided to the gate terminal of NEN, in which CXEN is C1EN for C1 and C2EN for C2. An additional resistor R is coupled between the drain terminal of NEN and to one current terminal of another pass gate GE. The other current terminal the pass gate GE is coupled to a bias voltage VB. The P-gate control terminal of the pass gate GE receives CXEN, and the corresponding N-gate control terminal of the pass gate GE receives CXEN B, which is an inverted version of CXEN.

Although not shown, there is an additional parasitic capacitance CPI (not shown) associated with XI and another parasitic capacitance CPO (not shown) associated with XO. Although the parasitic capacitances CPI and CPO may be the same, they are usually different. The balance capacitor CBX is intended to compensate for the difference in parasitic capacitances of XI and XO, so that the addition of CBX (CB1 for C1 coupled to XO and/or CB2 for C2 coupled to XI) equalizes the capacitances applied to XI and XO before adjustment of C1 and C2. In one embodiment, CBX is only added to one of the adjustable capacitors. For example, the parasitic capacitance CPI on XI may be greater than the parasitic capacitance CPO on XO, so that CB1 is only added to the tune capacitor C1 while CB2 is omitted for C2 (or CB2=0), to balance capacitance, or CPO+CB1=CPI. In another embodiment CBX is added to both adjustable capacitors with corresponding capacitances to balance capacitance of XI and XO before adjustment. In either case, a balance capacitor can be added to either C1 or C2, or both, to compensate for the parasitic capacitance of XI and XO to a balance capacitor CBAL, or CB1+CPO=CB2+CPI=CBAL. The balance capacitor also allows the maximum possible capacitance to reach higher values without increasing the number of bits or without increasing capacitor step size. Increasing the step size may result in a less accurate oscillation frequency by limiting the tuning accuracy.

In operation of the adjustable tune capacitor 600, each control bit CPX<0>-CPX<N> is asserted high to turn on the corresponding transistor switch N0-NN to connect the corresponding capacitor C0-CN between the capacitor terminals 602 and 604, and to turn off the corresponding pass gate G0-GN. Each control bit CPX<0>-CPX<N> is negated low to turn off the corresponding transistor switch N0-NN to remove or decouple the corresponding capacitor C0-CN from the capacitor terminal 604 and to turn on the corresponding pass gate G0-GN to instead couple the capacitor to VB. For example, when CPX<0> is asserted high, N0 is turned on so that C0 is coupled between the capacitor terminals 602 and 604, while the corresponding pass switch G0 is turned off to isolate C0 from VB. When CPX<0> is negated low, N0 is turned off so that C0 is isolated from the capacitor terminal 604, while the corresponding pass switch G0 is turned on to connect C0 to VB. Thus, the control bits CPX<0>-CPX<N> collectively form a digital control value CPX used to couple selected ones of the capacitors C0-CN in parallel in which the capacitances of the selected capacitors add to select the corresponding capacitance for the tune capacitor C1 or C2. The non-selected ones of the capacitors C0-CN are tied off to the bias voltage to remove and isolate them from the circuit.

The controller 216 enables the adjustable tune capacitor 600 by asserting CXEN high to turn on NEN to couple CBX into the circuit, and by asserting the control bits CPX<0>-CPX<N> to the desired digital control value CPX. The controller 216 disables the adjustable tune capacitor 600, or effectively removes it from the circuit, by negating CXEN low to remove CBX from the circuit, and by asserting the control bits CPX<0>-CPX<N> to a zero value for CPX. It is noted that for the OSC operating mode, CBX, if provided on XI or XO or both, may be included by asserting CXEN high to compensate for the difference in parasitic capacitance between XI and XO. In the BYP mode, however, if C2 is not disabled but is used for the AAC process, then CB2 may be removed by negating C2EN. The controller 216 adjusts C2 via CP2 during the AAC process for adjusting the level of the external oscillation signal capacitively coupled to XI.

FIG. 7 is a simplified block diagram illustrating the IC 100 configured to operate in the OSC mode including the crystal 702 externally coupled between XO and XI, in which the crystal 702 combined with the crystal amplifier 202 forms a crystal oscillator 700. The controller 216 asserts CE high to enable the amplifier 308, and asserts CBA to cause the current source 306 to drive the core bias current to the appropriate level to establish and maintain oscillation. The controller 216 sets the tune capacitors C1 and C2 to tune capacitances C1T and C2T, respectively, which establish oscillation at the target frequency. The controller 216 asserts one or both C1EN and C2EN to insert one or both of CB1 or CB2 to compensate for parasitic capacitance, and asserts CP1 and CP2 to adjust C1 and C2, respectively. C1T incorporates any parasitic capacitance of XO and C1T incorporates any parasitic capacitance of XI. Generally, the combined capacitance or equivalent tune (or load) capacitance "CL" is determined for a given crystal. The combination of the capacitors C1 and C2 and parasitic capacitance should be equal to the tune capacitance CL, or CL=C1T*C2T/(C1T+C2T) in which an asterisk "*" denotes multiplication (the combination is determined in a similar manner as the capacitors coupled in series). C1T and C2T may each have the same capacitance, such as both equal to CL/2. C1T and C2T, however, may be different so long as their combined capacitance is CL.

The oscillating signal appearing on XI in the OSC mode may be provided to at least one external device, although the XO system 102 may not support more than one external device.

FIG. 8 is a simplified block diagram illustrating the IC 100 configured to operate in the BYP mode and receiving an external oscillation signal from an external oscillator 802 according to one embodiment of the present invention. Advantageously, the external oscillator 802 may be powered by the internal voltage regulator 312 providing VEXT via the unused XO pin as shown. Alternatively, the external oscillator 802 may be powered by an external source (not shown). The external oscillator 802 provides an oscillating signal to the XI input of the IC 100. The controller 216 negates CE low to disable the amplifier 308 and sets CBA so that the core bias current is zero. This effectively disables the amplifier core 210. In one embodiment when the external oscillation signal asserts the oscillation signal at the target amplitude, the tune capacitors C1 and C2 are both disabled or removed; in particular, the control bits CPX and the enable signal CXEN for both capacitors are negated low. The oscillation signal from the external oscillator 802 is internally provided to the squaring buffer 218 for generating the CLK1-CLKM signals as previously described. It is noted that the external oscillator 802 may be implemented as the IC 100 in OSC mode as shown in FIG. 7. The external oscillator 802 may also be a temperature compensated crystal oscillator (TCXO) or the like. In one embodiment, the external oscillation signal asserts the oscillation signal at (or sufficiently near) the target amplitude. In an alternative embodiment as described further below, the external oscillation signal may have an excessive amplitude, in which case the capacitor C2 may be enabled and adjusted to achieve the desired amplitude.

In the illustrated configuration of FIG. 8, the regulator 312 is enabled to generate the VEXT voltage to provide a source voltage to the external oscillator 802. The XO pin is re-provisioned by opening the switch SXO to externally provide VEXT to a power input of the external oscillator 802. If a separate source voltage (not shown) is available to the external oscillator 802, then the regulator 312 can be disabled.

FIG. 9 is a simplified block diagram illustrating the IC 100 configured to operate in the BYP mode for receiving an external oscillation signal from a capacitively-coupled external source and further including amplitude control for controlling the amplitude of the external oscillation signal according to one embodiment of the present invention. The external oscillation signal, shown provided from a TCXO 902, may be powered by the internal voltage regulator 312 similar to that shown in FIG. 8, although it is understood that the TCXO 902 may be powered by another source. In this case the TCXO 902 outputs the external oscillation signal with an excessive amplitude that is not suitable for direct use by the IC 100. In the embodiment shown in FIG. 9, an external capacitor CEXT is coupled between the output of the TCXO 902 and the input pin XI of the IC 100. The capacitor C1 may be disabled as previously described. Furthermore, the capacitor C2 is not disabled, but is instead is enabled and set to an adjustable capacitance C2D suitable to reduce the voltage of the external oscillation signal to a target amplitude suitable for the IC 100. In this case, CEXT and C2 (with capacitance C2D) forms a capacitive voltage divider that reduces the voltage amplitude of the external oscillation signal to the target level. The value of C2, or C2D, may be determined by the AAC process performed by the controller 216 as previously described to set the oscillation signal appearing on XI to the target amplitude. The oscillation signal from the TCXO 902 is internally provided to the squaring buffer 218 for generating the CLK1-CLKM signals.

In the illustrated configuration of FIG. 9, the regulator 312 may be enabled to generate the VEXT voltage to provide a source voltage to the TCXO 902. The XO pin is re-provisioned by opening the switch SXO to externally provide VEXT to a power input of the TCXO 902.

FIG. 10 is a simplified block diagram illustrating the IC 100 configured to operate in the BYP mode for receiving an external oscillation signal directly from an external source and further including amplitude control for controlling the amplitude of the external oscillation signal according to another embodiment of the present invention. FIG. 10 is substantially similar to FIG. 9 except that the external capacitor CEXT is eliminated so that the output of TCXO 902 is directly coupled to XI rather than being capacitively coupled. FIG. 10 is substantially similar to FIG. 8 except that the TCXO 902 provides the oscillation signal with an excessive amplitude that is not suitable for direct use by the IC 100. In this case, rather than disabling C2, the capacitor C2 is enabled and adjusted to an impedance value C2I that presents an impedance value to the output of the TCXO 902 to reduce the amplitude of the external oscillation signal provided to XI. Since CEXT is eliminated, the capacitive voltage divider function is removed and C2 instead presents a current limit impedance to reduce the amplitude of the external oscillation signal.

A potential issue with the configuration of FIG. 10 is that the waveform of the external oscillation signal may be distorted. As shown, for example, the sinusoidal waveform normally output by the TCXO 902 may be distorted into a triangular waveform or the like. Nonetheless, the frequency of the external oscillation signal remains substantially unmodified, and the squaring buffer 218 still operates to convert the signal on XI into the square wave clock signal CK. Also, the level detector 304 may still detect the amplitude of the signal on XI to provide LD so that the controller 216 may set the value of C2 accordingly. Operation of the IC 100 is substantially the same as that of FIG. 9 except that the capacitance values C2D and C2I may be different.

FIG. 11 is a schematic and block diagram of the crystal amplifier of FIG. 2 implemented according to another embodiment of the present invention shown coupled to a controller, and further including a select circuit, a level detector, a memory, and a voltage regulator. The embodiment shown in FIG. 11 is essentially identical to the embodiment of FIG. 3, including the same components referenced by the same reference numerals and coupled in the same manner, except that the switch SXO is moved along the conductive signal line providing VEXT and is controlled by RE rather than RE. When the amplifier 308 is placed in BYP mode, it exhibits a high impedance to the external pin XO. As shown in FIGS. 4 and 5, for example, when CE is low opening switch S1, the amplifier 308 is disabled (either CMOS or NMOS) and presents a high impedance to XO. When the controller 216 asserts RE high and enables the voltage regulator 312, such as during selected BYP operating mode, the switch SXO is closed so that VEXT may be provided externally via the XO pin.

FIG. 12 is a schematic and block diagram illustrating another variation according to another embodiment of the present invention in which the voltage regulator switch SXO is eliminated. The embodiment shown in FIG. 12 is intended to be similar to that shown in FIG. 3 or 11, except that the switch SXO is eliminated and the output of the voltage regulator 312 and the amplifier 308 are both directly coupled to XO. Although not shown, the voltage regulator 312 may have a switch function or the like at its output that effectively decouples it from XO when not enabled, or at least presents a high impedance output. Thus, when RE is negated low, the voltage regulator 312 is not enabled and its output does not affect normal operation of the XO output and the amplifier 308. When RE is asserted high to enable the voltage regulator 312, it drives VEXT externally via XO.

It is noted that any of the embodiments shown in FIGS. 3, 8, 9, 10 and 11 provide a significant benefit for low power operation. When the internal voltage regulator 312 is used to provide power to an external oscillator as shown in each case, then the voltage regulator 312 may be disabled via the regulator enable signal RE from the controller 216, the external oscillator (e.g., 802, or TCXO 902 or the like) is also powered down to reduce power consumption and save a considerable amount of power. The ability to power down the external oscillator by disabling the voltage regulator or otherwise indirectly from the XO system 102 eliminates the need of having to provide and control an enable input of the external oscillator.

FIG. 13 is a simplified schematic diagram illustrating yet another embodiment in which an available voltage of the IC 100 (or the XO system 102), shown as VA, is provided via the XO pin to provide the external voltage VEXT. The term "available voltage" is defined to mean any voltage that is routed to the re-provisioned XO pin for use as an external source voltage, such as by the external oscillator 802 or the TCXO 902 or the like. The available voltage may be internally generated or may simply be re-routed to the XO pin. The use of an available voltage can eliminate the need for an additional voltage regulator. One example of VA is the source voltage VDDA, although any other suitable voltage may be used. Thus, rather than providing an additional voltage regulator 312, any other available voltage of the IC 100 or the XO system 102 may be used as VA. In the BYP mode, the XO pin is re-provisioned via the switch SXO, controlled by RE in a similar manner as shown in FIG. 11, to provide VA externally as VEXT via the XO pin. In this case, the switch SXO is added between VA and the XO pin and controlled by an enable signal, such as RE.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A crystal driver integrated circuit with external oscillation signal amplitude control, comprising:
   an amplifier core having an input coupled to an amplifier input node and having an output coupled to an amplifier output node;
   an input pin coupled to said amplifier input node and an output pin coupled to said amplifier output node;
   an adjustable capacitor coupled between said amplifier input node and a reference node; and
   a controller that operates said amplifier core in any one of a plurality of operating modes including an oscillator mode in which said controller enables said amplifier core to drive an external crystal coupled between said input and output pins to oscillate at a target frequency, and a bypass mode in which said controller disables said amplifier core and adjusts said adjustable capacitor so that an amplitude of an oscillation signal coupled via said input pin has a target amplitude.

2. The crystal driver integrated circuit of claim 1, further comprising:
   a memory that stores a capacitor level value; and
   wherein said controller uses said capacitor level value to adjust said adjustable capacitor.

3. The crystal driver integrated circuit of claim 1, further comprising:
   a level detector having an input receiving an amplitude value indicative of a level of said amplifier input node and having an output providing a level detect value to said controller; and
   wherein said controller adjusts said adjustable capacitor until said level detect value indicates that said amplitude of said oscillation signal has said target amplitude.

4. The crystal driver integrated circuit of claim 3, further comprising:
   a memory that stores a threshold value indicative of said target amplitude; and
   wherein said level detector compares said threshold level with said amplitude value to provide said level detect value.

5. The crystal driver integrated circuit of claim 3, further comprising:
   a memory; and
   wherein said controller determines a capacitor level value that can be used to adjust said adjustable capacitor so that said amplitude of said oscillation signal has said target amplitude, and stores said capacitor level value into said memory.

6. The crystal driver integrated circuit of claim 1, further comprising:
   a voltage regulator having an output providing a source voltage to said output pin when enabled during said bypass mode; and
   a switch that couples said output pin and said amplifier output node during said oscillator mode and that decouples said output pin from said amplifier output node during said bypass mode.

7. The crystal driver integrated circuit of claim 1, further comprising:
   a voltage regulator having an output providing a source voltage; and
   a switch that selectively provides said source voltage to said output pin during said bypass mode.

8. The crystal driver integrated circuit of claim 1, further comprising a voltage regulator having an output providing a source voltage to said output pin when enabled during said bypass mode.

9. The crystal driver integrated circuit of claim 1, further comprising a switch that selectively couples an available voltage of the crystal driver integrated circuit to said output pin during said bypass mode.

10. An electronic circuit, comprising:
    an external oscillator having an output providing an oscillation signal; and
    a crystal driver integrated circuit with external oscillation signal amplitude control, comprising:
       an amplifier core having an input coupled to an amplifier input node and having an output coupled to an amplifier output node;
       an input pin coupled to said amplifier input node and an output pin coupled to said amplifier output node, wherein said oscillation signal is provided to said input pin;
       an adjustable capacitor coupled between said amplifier input node and a reference node; and
       a controller that operates said amplifier core in any one of a plurality of operating modes including an oscillator mode in which said controller enables said amplifier core to drive an external crystal to oscillate at a target frequency, and a bypass mode in which said controller disables said amplifier core and adjusts said adjustable capacitor so that an amplitude of said oscillation signal received at said input pin via said external capacitor has a target amplitude.

11. The electronic circuit of claim 10, further comprising an external capacitor having a first terminal coupled to said output of said external oscillator and having a second terminal coupled to said input pin of said crystal driver integrated circuit.

12. The electronic circuit of claim 10, wherein said crystal driver integrated circuit further comprises:
   a level detector having an input receiving an amplitude value indicative of a level of said amplifier input node and having an output providing a level detect value to said controller; and
   wherein said controller adjusts said adjustable capacitor until said level detect value indicates that said amplitude of said oscillation signal has said target amplitude.

13. The electronic circuit of claim 12, wherein said crystal driver integrated circuit further comprises:
   a memory that stores a threshold value indicative of said target amplitude; and
   wherein said level detector compares said threshold level with said amplitude value to provide said level detect value.

14. The electronic circuit of claim 12, wherein said crystal driver integrated circuit further comprises:
   a memory; and
   wherein said controller determines a capacitor level value that can be used to adjust said adjustable capacitor so that said amplitude of said oscillation signal has said target amplitude, and stores said capacitor level value into said memory.

15. The electronic circuit of claim 10, wherein said crystal driver integrated circuit further comprises:
   a voltage regulator having an output providing a source voltage to said output pin when enabled during said bypass mode; and
   wherein said external oscillator has a power input that is coupled to said output pin of said crystal driver integrated circuit.

16. The electronic circuit of claim 10, wherein said crystal driver integrated circuit further comprises:
   a switch that selectively provides an available voltage of said crystal driver integrated circuit to said output pin of said crystal driver integrated circuit; and
   wherein said external oscillator has a power input that is coupled to said output pin of said crystal driver integrated circuit.

17. A method of controlling the amplitude of an oscillation signal provided to a crystal driver integrated circuit comprising:
   providing the crystal driver integrated circuit with an amplifier core having an input coupled to an amplifier input node and having an output coupled to an amplifier output node, an input pin coupled to the amplifier input node and an output pin coupled to the amplifier output node;
   providing the crystal driver integrated circuit with an adjustable capacitor coupled between the amplifier input node and said reference node; and
   during a bypass mode:
      disabling the amplifier core; and
      adjusting the adjustable capacitor so that an amplitude of an oscillation signal coupled via the input pin has a target amplitude.

18. The method of claim 17, wherein said adjusting the adjustable capacitor comprises retrieving a stored capacitor level value.

19. The method of claim 17, further comprising:
   comparing the amplitude of the oscillation signal received via the input pin with a predetermined threshold value and providing a level detect value indicative thereof; and
   wherein said adjusting the adjustable capacitor comprises adjusting the adjustable capacitor until the level detect value is provided.

20. The method of claim 17, further comprising providing, by the crystal driver integrated circuit, an available voltage to the output pin during the bypass mode.

* * * * *